United States Patent
Kim et al.

(10) Patent No.: US 8,207,000 B2
(45) Date of Patent: Jun. 26, 2012

(54) MANUFACTURING METHOD OF FLAT PANEL DISPLAY

(75) Inventors: Myung-Hwan Kim, Yongin-si (KR); Dae-Jin Park, Incheon (KR); Jung-Hun Noh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 12/831,074

(22) Filed: Jul. 6, 2010

(65) Prior Publication Data

US 2011/0092004 A1    Apr. 21, 2011

(30) Foreign Application Priority Data

Oct. 15, 2009    (KR) .................. 10-2009-0098340

(51) Int. Cl.
*H01L 21/00* (2006.01)

(52) U.S. Cl. ........... 438/28; 257/E21.395; 257/E21.411; 257/E21.413; 257/E21.414; 438/149; 438/455; 438/654

(58) Field of Classification Search ........... 257/E21.395, 257/E21.411, E21.413, E21.414; 438/28, 438/149, 455, 654

See application file for complete search history.

(56) References Cited

U.S. PATENT DOCUMENTS

| | | | |
|---|---|---|---|
| 6,019,271 A | 2/2000 | Hayden et al. | |
| 6,816,226 B2 | 11/2004 | Bouten | |
| 2001/0001285 A1* | 5/2001 | Moh | 428/343 |
| 2005/0274408 A1* | 12/2005 | Li et al. | 136/244 |
| 2006/0251805 A1 | 11/2006 | White et al. | |
| 2007/0091062 A1* | 4/2007 | French et al. | 345/107 |

FOREIGN PATENT DOCUMENTS

| | | |
|---|---|---|
| JP | 60-142325 | 7/1985 |
| KR | 10-2007-0012960 A | 1/2007 |
| WO | 2008-094368 A1 | 8/2008 |

* cited by examiner

*Primary Examiner* — Asok Sarkar
(74) *Attorney, Agent, or Firm* — Innovation Counsel LLP

(57) ABSTRACT

A manufacturing method of a flat panel display according to an exemplary embodiment of the present invention includes: coating a first adhering member on a first supporting plate; disposing a first substrate on the first adhering member; using ultrasonic waves to adhere the first supporting plate and the first substrate; and forming a gate line, a data line, a thin film transistor connected to the gate line and the data line, and a pixel electrode connected to the thin film transistor on the first substrate. According to the manufacturing method of the flat panel display according to an exemplary embodiment of the present invention, the first adhering member made of the plurality of adhering particles is melted by using the ultrasonic waves without an additional adhering film to adhere the flexible first substrate and the first supporting plate, thereby reducing the overall manufacturing cost.

14 Claims, 6 Drawing Sheets

MANUFACTURING METHOD OF FLAT PANEL DISPLAY

CROSS-REFERENCE TO RELATED APPLICATION

This application claims priority to and the benefit of Korean Patent Application No. 10-2009-0098340 filed in the Korean Intellectual Property Office on Oct. 15, 2009, the entire content of which is incorporated herein by reference.

BACKGROUND OF THE INVENTION (a) Field of the Invention

The present invention relates to a manufacturing method of a flat panel display.

(b) Description of the Related Art

There are a number of flat panel displays that are currently popular. For example, liquid crystal displays (LCDs), plasma display devices (PDPs), organic light emitting devices (OLEDs), field effect displays (FEDs), and electrophoretic display devices are all gaining popularity. Among them, liquid crystal displays are one of the most commonly used flat panel displays. Typically, an LCD includes two substrates with electrodes formed thereon and a liquid crystal layer interposed between the two substrates. In an LCD, a voltage is applied to the electrodes to align liquid crystal molecules of the liquid crystal layer and regulate the transmission of light through the liquid crystal layer.

Recently, a plastic substrate has been used in LCDs to impart light weight and thinness to the flat panel display. Here, a supporting plate is used to support a flexible plastic substrate, a plurality of thin films are formed on the plastic substrate, and when the flat panel display is completed, the supporting plate is removed from the plastic substrate.

During this process, an adhering film having high heat resistance and high transmittance is used for adhering the plastic substrate to the supporting plate. Use of the adhering film increases the number of steps of the manufacturing method, and having to remove the adhering film from the flat panel display after completing the flat panel display adds to the processing cost.

Also, the plastic substrate sometimes curves due to a difference of heat expansion coefficients between the plastic substrate and the supporting plate when hardening and melting the adhering film such that it is difficult to manufacture a flat panel display with a large area.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a manufacturing method of a flat panel display that is capable of manufacturing a flat panel display with a large area without bending/warping of the plastic substrate, and reducing the overall manufacturing cost.

A manufacturing method of a flat panel display according to an exemplary embodiment of the present invention includes: coating a first adhering member on a first supporting plate; disposing a first substrate on the first adhering member; using ultrasonic waves to adhere the first supporting plate to the first substrate; and forming a gate line, a data line, a thin film transistor connected to the gate line and the data line, and a pixel electrode connected to the thin film transistor on the first substrate.

The method may further include: coating a second adhering member on a second supporting plate; disposing a second substrate on the second adhering member; using ultrasonic waves to adhere the second supporting plate to the second substrate; and forming a common electrode on the second substrate.

The first adhering member may include a plurality of adhering particles.

The first adhering member may further include a polyelectrolyte.

The polyelectrolyte may electrostatically couple the plurality of adhering particles to the first supporting plate.

The first adhering member may be formed on the first supporting plate by using an ultrasonic wave spray coating device.

The first adhering member and the second adhering member may respectively have a thickness of about 10 nm to about 1 μm.

The adhering particles may include particles with a size of less than a micrometer.

The adhering particles may include particles having diameters of about a nanometer.

The plurality of adhering particles may include first adhering particles having a first reactor and second adhering particles having a second reactor, and the first adhering particles having the first reactor and the second adhering particles having the second reactor may be combined by the ultrasonic waves.

The method may further include combining the first substrate and the second substrate, and removing the first adhering member and the second adhering member by using a laser beam to separate the first supporting plate and the second supporting plate from the first substrate and the second substrate.

A manufacturing method of a flat panel display according to another exemplary embodiment of the present invention includes: coating a first adhering member on the first substrate; disposing the first substrate coated with the first adhering member on the first supporting plate to face the first adhering member and the first supporting plate to each other; using ultrasonic waves to adhere the first supporting plate to the first substrate; and forming a gate line, a data line, a thin film transistor connected to the gate line and the data line, and a pixel electrode connected to the thin film transistor on the first substrate.

The method may include: coating a second adhering member on the second substrate; disposing the second substrate coated with the second adhering member on the second supporting plate to face the second adhering member and the second supporting plate to each other; melting the second adhering member by using ultrasonic waves to adhere the second supporting plate and the second substrate; and forming a common electrode on the second substrate.

The first adhering member may include a plurality of adhering particles.

The first adhering member may further include a polyelectrolyte.

The polyelectrolyte may electrostatically couple the plurality of adhering particles to the first supporting plate.

The first adhering member may be formed on the first supporting plate by using an ultrasonic wave spray coating device.

The first adhering member and the second adhering member may respectively have a thickness of about 10 nm to about 1 μm.

The plurality of adhering particles may include first adhering particles having a first reactor and second adhering particles having a second reactor, and the first adhering particles having the first reactor and the second adhering particles having the second reactor may be combined by the ultrasonic waves.

The method may include combining the first substrate and the second substrate, and removing the first adhering member and the second adhering member by using a laser beam to separate the first supporting plate and the second supporting plate from the first substrate and the second substrate.

According to the present invention, the first adhering member made of the plurality of adhering particles is melted by using the ultrasonic waves without an additional adhering film to attach the flexible first substrate and the first supporting plate, thereby reducing the manufacturing cost.

Since the adhering film is not used, the hardening and melting process that is performed at a high temperature is not necessary for the method. By avoiding the high-temperature process, any bending/warping of the flexible first substrate is also avoided. Hence, it is possible to manufacture flat panel displays of large areas.

Also, the first and second adhering members are thin such that the first and second adhering members may be substantially completely removed from the first and second supporting plates by using the laser beam. The first and second supporting plates may be reused.

DETAILED DESCRIPTION OF THE EMBODIMENTS

Figure 1:
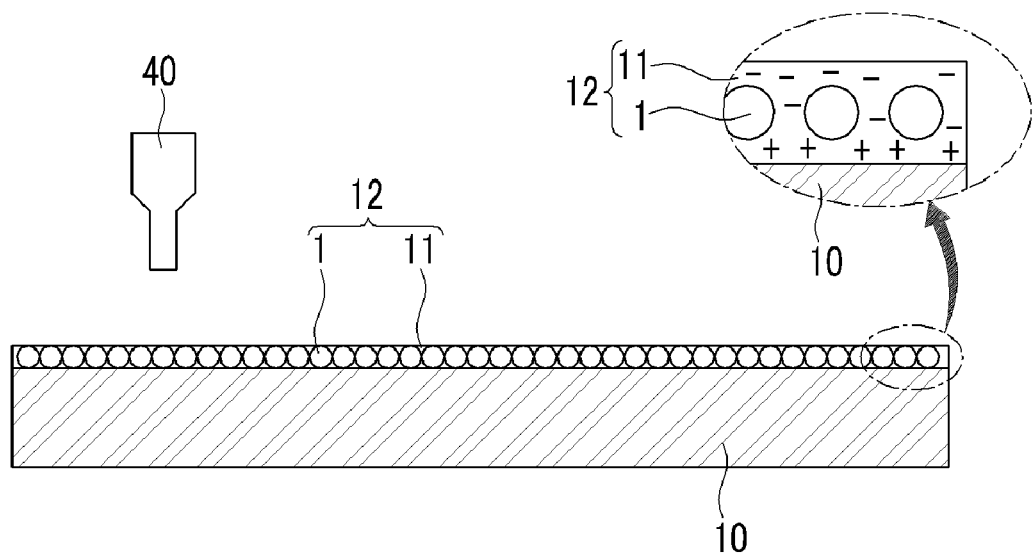
FIG. 1 to FIG. 3 are views sequentially showing a manufacturing method of a thin film transistor array panel of a flat panel display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may be present. In contrast, when an element is referred to as being "directly on" another element, there are no intervening element present.

Now, a manufacturing method of a flat panel display according to an exemplary embodiment of the present invention will be described with reference to FIG. 1 to FIG. 7.

Figure 2:
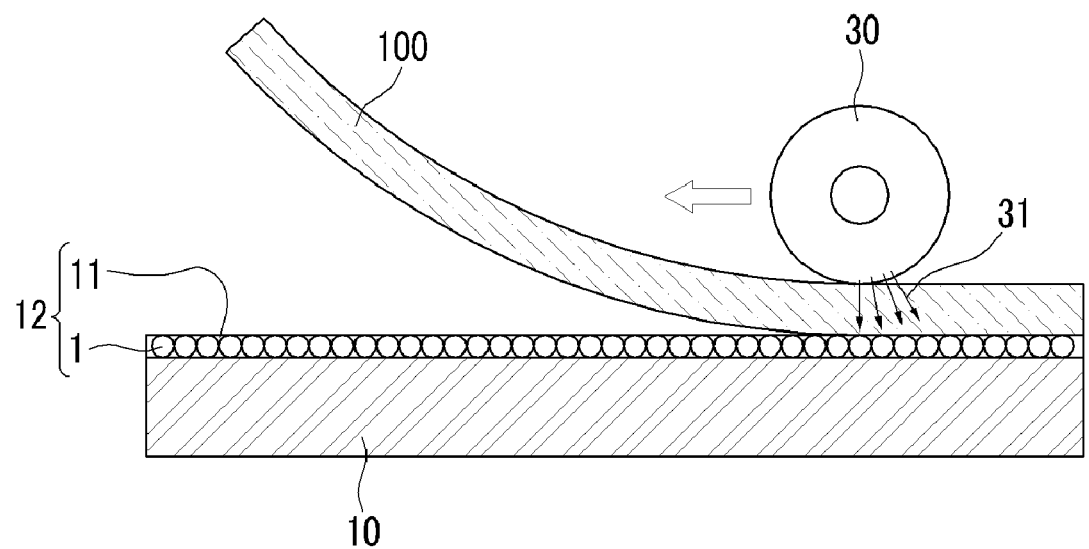
Figure 3:
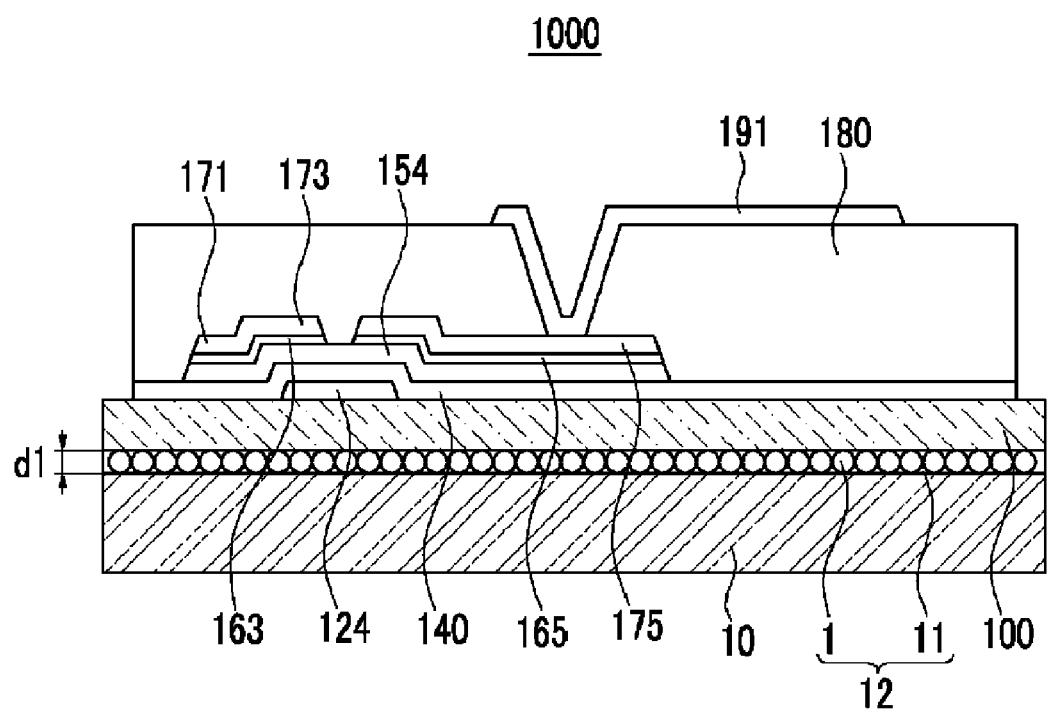

FIG. 1 to FIG. 3 are views sequentially showing a manufacturing method of a thin film transistor array panel of a flat panel display according to an exemplary embodiment of the present invention.

First, as shown in FIG. 1, the first adhering member 12 is coated on a first supporting plate 10 by using an ultrasonic wave spray coating device 40. The first supporting plate 10 may be made of a rigid material such as glass, SUS (steel use stainless), or plastic. The first adhering member 12 may include a plurality of adhering particles 1 and a polyelectrolyte 11. The plurality of adhering particles 1 are made of a material such as a polyimide, and each particle has a spherical shape with a diameter that may be less than a micron. In some cases, the diameter may be in the order of a nanometer (nm). The adhering particles 1 include first adhering particles having a first reactor and second adhering particles having a second reactor.

An example of the first reactor may be COOH—, and an example of the second reactor may be NH2+.

Examples of the polyelectrolyte 11, which is generally a material with a high molecular weight having a positive or negative charge, include polyacrylic acid, polyamic acid, polyvinyl alcohol, and polyarylamine. The polyelectrolyte 11 electrostatically couples the plurality of adhering particles 1 to the first supporting plate 10 for the plurality of adhering particles 1 to securely adhere to the first supporting plate 10. The polyelectrolyte 11 may be coated on the first supporting plate 10 along with the plurality of adhering particles 1 by using the ultrasonic wave spray coating device 40. Alternatively, the polyelectrolyte 11 is coated on the first supporting plate 10 before the plurality of adhering particles 1 are uniformly coated on the first supporting plate 10 by using the ultrasonic wave spray coating device 40.

As described above, the plurality of adhering particles 1 are adhered to the first supporting plate 10 by using the polyelectrolyte 11. However, the first supporting plate 10 may be surface-treated using plasma discharge, corona discharge, or an alkali solvent for the plurality of adhering particles 1 to adhere well to the first supporting plate 10.

Next, as shown in FIG. 2, a first substrate 100 is disposed on the first adhering member 12 coated on the first supporting plate 10. The first substrate 100 includes a flexible material such as plastic. Next, the first substrate 100 is pressed while an ultrasonic wave generation device 30 with a roller shape is rolled on the first substrate 100. Here, the ultrasonic wave generation device 30 generates ultrasonic waves 31. The ultrasonic waves 31 generated by the ultrasonic wave generation device 30 produce frictional heat at the interface between the first supporting plate 10 and the first adhering member 12, and at the interface between the first substrate 100 and the first adhering member 12.

The adhering particles may include a first adhering particles and a second adhering particles. The first adhering particles may include a first reactor and the second adhering particles may include a second reactor. Upon receiving heat, the first and second adhering particles are melted and coupled by the frictional heat, thereby attaching the first supporting plate 10 and the first substrate 100 to each other.

For example, when the plurality of adhering particles 1 include the first adhering particles of COOH— as a polyimide-based polymer and the second adhering particles of NH2+ as a polyimide-based polymer, the first adhering particles of COOH— and the second adhering particles of NH2+ are melted by the frictional heat of the ultrasonic wave 31. Upon melting, the second adhering particles NH2+ become coupled to the polyimide-based polymer COOH—, thereby making the first supporting plate 10 adhere to the first substrate 100.

As described above, the first adhering member 12 made of the plurality of adhering particles 1 of a small amount is melted and chemically reacted by using the ultrasonic waves 31 without an additional film to adhere the flexible first substrate 100 and the first supporting plate 10. By eliminating the extra step of attaching an adhering film to the flexible first substrate 100, the above method reduces the manufacturing cost. Also, since the adhering film is not used, the hardening and melting process at a high temperature is not necessary. Without the use of a high-temperature process, the surface of the first substrate 100 and the first supporting plate 10 only receive the frictional heat such that the first substrate 100 and the first supporting plate 10 are maintained at room temperature. Any bending/warping of the flexible first substrate 100 due to the difference of the heat expansion coefficients is avoided, and it becomes possible to manufacture large flat panel displays.

The first adhering member 12 may have a thickness d1 of about 10 nm to about 1 μm. When the thickness of the first adhering member 12 is less than 10 nm, the adhesion may be compromised. When the thickness of the first adhering member 12 is larger than 1 μm, it is difficult to completely remove the first adhering member 12 at a later process.

As described above, the first adhering member 12 has a thickness of about 10 nm to about 1 μm, such that it may be substantially completely removed by using a laser beam when removing the first supporting plate 10 from the first substrate 100. Accordingly, the first supporting plate 10 may be reused, thereby reducing the manufacturing cost.

Next, as shown in FIG. 3, a gate line including a gate electrode 124 is formed on the first substrate 100. A layer of silicon nitride or silicon oxide is coated on the first substrate 100 including the gate line to form a gate insulating layer 140. Also, a semiconductor layer that is not doped with an impurity and a semiconductor layer that is doped with an n-type impurity at a high concentration are formed on the gate insulating layer 140. The semiconductor material may be made of amorphous silicon. Next, the semiconductor layer that is not doped with an impurity and the semiconductor layer that is doped with an impurity are etched by a photolithography process to form a semiconductor layer 154 and ohmic contact layers 163 and 165 on the gate insulating layer 140. A data line 171 including a source electrode 173 and a drain electrode 175 are formed on the gate insulating layer 140 and the ohmic contact layers 163 and 165. A gate electrode 124, a source electrode 173, and a drain electrode 175 form a thin film transistor (TFT) along with the semiconductor layer 154, and the channel of the thin film transistor is formed in the semiconductor 154 between the source electrode 173 and the drain electrode 175.

Next, an insulating material is coated on the whole surface of the first substrate 100 including the data line 171 and the drain electrode 175 to form a passivation layer 180. Next, a transparent conductive layer is formed on the passivation layer 180 and patterned to form a pixel electrode 191, thereby completing a thin film transistor array panel 1000.

Next, a manufacturing method of the common electrode panel for the flat panel display will be described.

Figure 4:
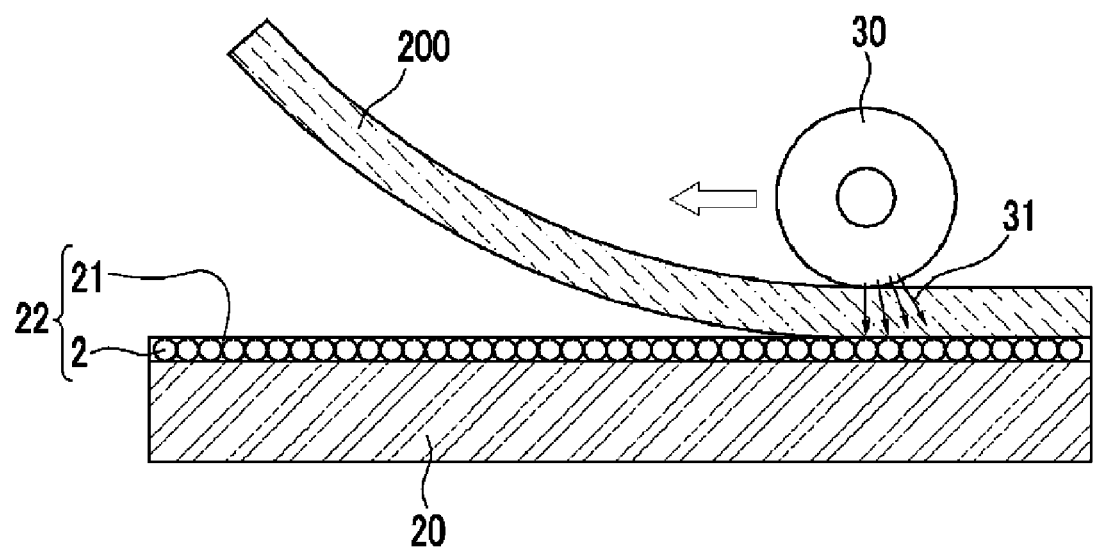
FIG. 4 and FIG. 5 are views sequentially showing a manufacturing method of a common electrode panel of a flat panel display according to an exemplary embodiment of the present invention.
Figure 5:
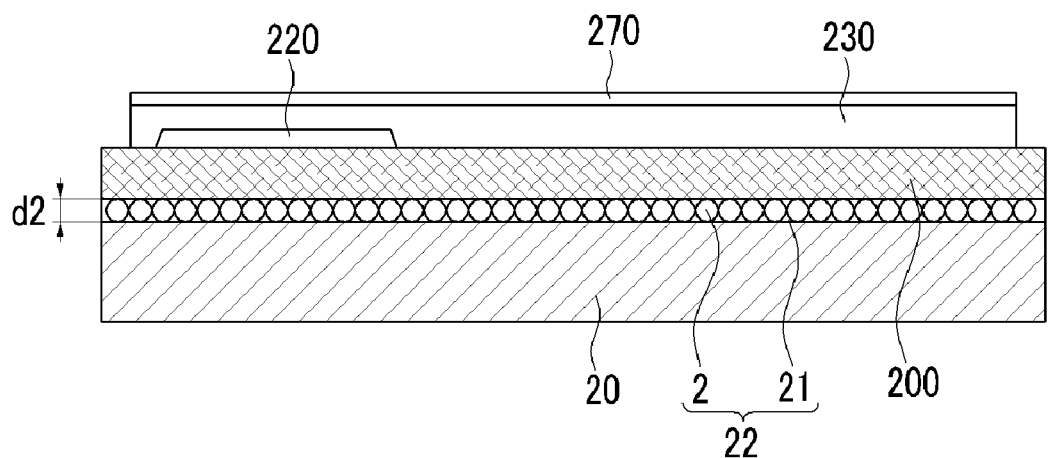

FIG. 4 and FIG. 5 are views sequentially showing a manufacturing method of a common electrode panel of a flat panel display according to an exemplary embodiment of the present invention.

As shown in FIG. 4, a second adhering member 22 is coated on a second supporting plate 20 by using the ultrasonic wave spray coating device 40. The second supporting plate 20 may be made of a rigid material such as glass, SUS (steel use stainless), and plastic. The second adhering member 22 may include a plurality of adhering particles 2 and a polyelectrolyte 21. The plurality of adhering particles 2 are made of a material such as polyimide, and each particle has a spherical shape with a diameter less than a micron. In some cases, the diameter of a particle may be in the order of a nanometer (nm). The plurality of adhering particles 2 include the first adhering particles having a first reactor and a second adhering particles having the second reactor. An example of the first reactor may be COOH—, and n example of the second reactor may be NH2+.

The polyelectrolyte 21 electrostatically couples the plurality of adhering particles 2 to the second supporting plate 20 for the plurality of adhering particles 2 to securely adhere to the second supporting plate 20. As described above, the plurality of adhering particles 2 adhere to the second supporting plate 20 by using the polyelectrolyte 21. However, the second supporting plate 20 may be surface-treated using plasma discharge, corona discharge, or an alkali solvent for the plurality of adhering particles 2 to be well adhered to the first supporting plate 20.

A second substrate 200 is disposed on the first adhering member 22 coated on the second supporting plate 20. The second substrate 200 includes a flexible material such as plastic. Also, the second substrate 200 is pressed while the ultrasonic wave generation device 30 of a roller shape is rolled on the second substrate 200. Here, the ultrasonic wave generation device 30 generates the ultrasonic waves 31. The ultrasonic waves 31 generated in the ultrasonic wave generation device 30 produce frictional heat at the interface between the second supporting plate 20 and the second adhering member 12, and at the interface between the second substrate 200 and the second adhering member 22.

The first adhering particles having the first reactor and the second adhering particles having the second reactor are melted and coupled by the frictional heat. Due to this coupling, the second supporting plate 20 and the second substrate 200 adhere to each other.

For example, when the plurality of adhering particles 1 include the first adhering particles of COOH— as a polyimide-based polymer and the second adhering particles of NH2+ as a polyimide-based polymer, the first adhering particles of COOH— as a polyimide-based polymer and the second adhering particles of NH2+ as a polyimide-based polymer are melted by the frictional heat produced by the ultrasonic waves 31 and coupled into the polyimide-based polymer COOH—. Hence, the second supporting plate 10 and the second substrate 100 adhere to each other.

The second adhering member 22 may have a thickness d1 of about 10 nm to about 1 μm. When the thickness of the second adhering member 22 is less than 10 nm, the adhesion may be compromised. When the thickness of the second adhering member 22 is larger than 1 μm, it is difficult to completely remove the second adhering member 22 at a later process.

Next, as shown in FIG. 5, a light blocking member 220 is formed on the second substrate 200, and a color filter 230 covering the second substrate 200 and the light blocking member is formed. Also, a common electrode 270 is formed on the color filter 230 to complete the common electrode panel 2000 for the flat panel display.

Next, the completed thin film transistor array panel 1000 and the completed common electrode panel 2000 for the flat panel display are combined, and the first supporting plate 10 and the second supporting plate 20 are separated from the thin film transistor array panel and the common electrode panel for the flat panel display, which will be described with reference to drawings.

Figure 6:
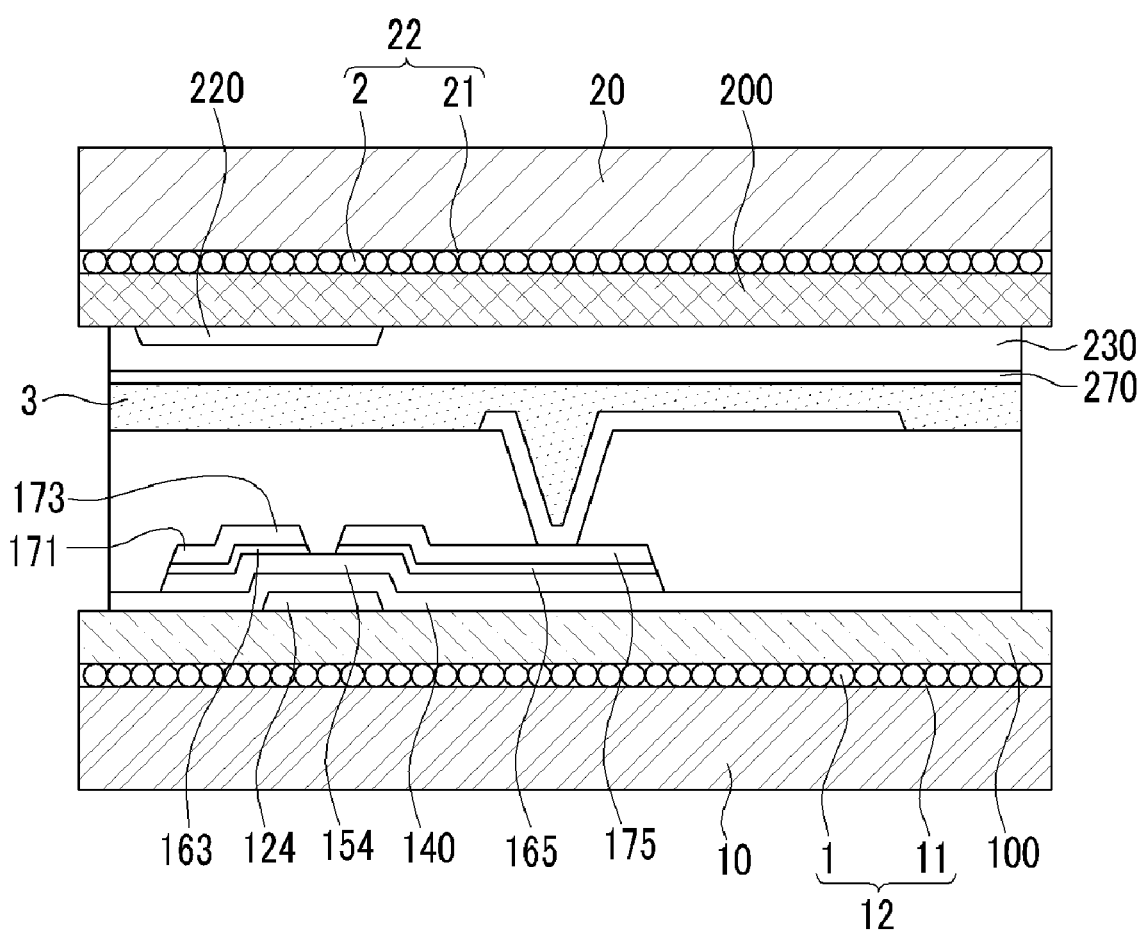
FIG. 6 is a view of a thin film transistor array panel and a common electrode panel combined for a flat panel display according to an exemplary embodiment of the present invention.
Figure 7:
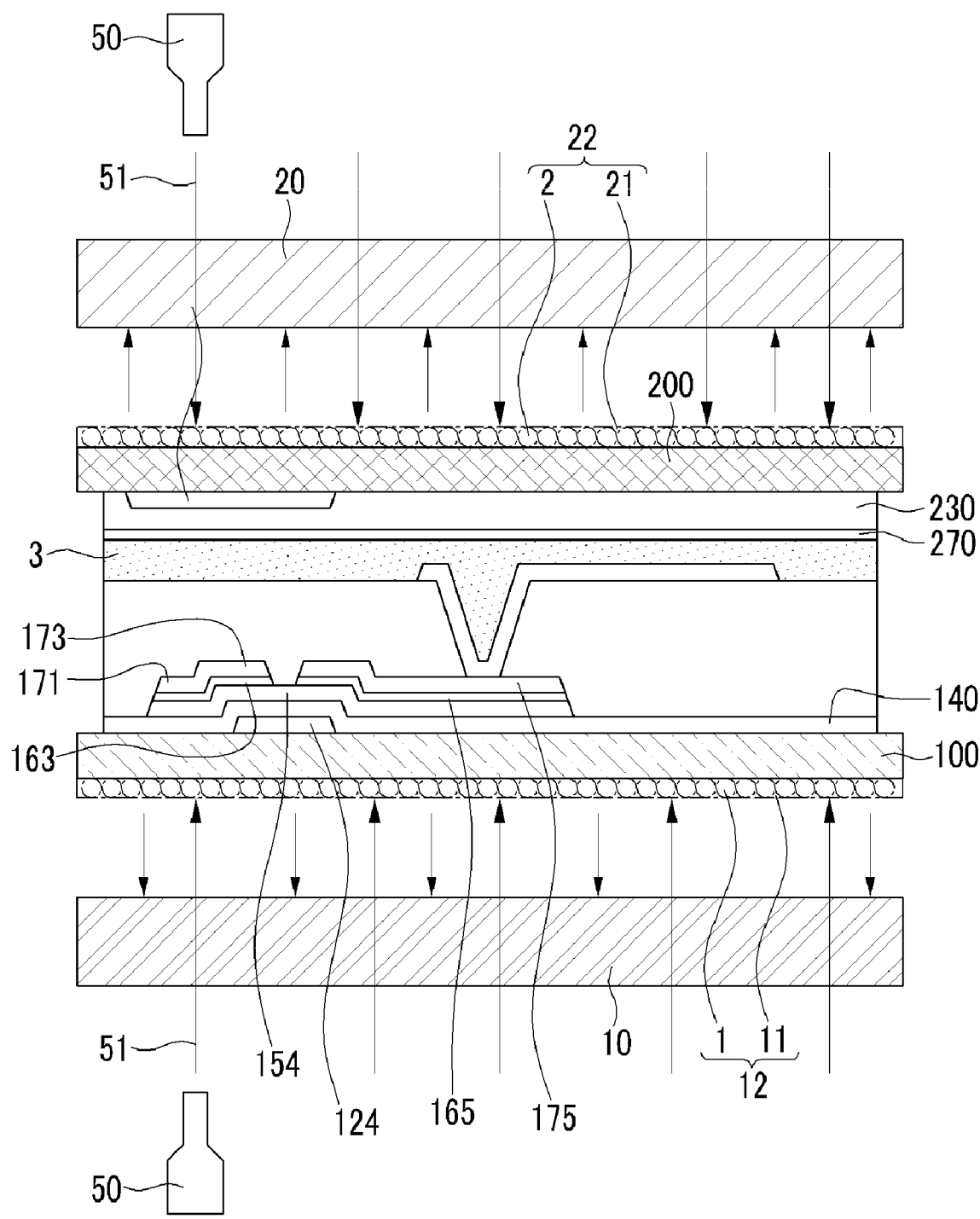
FIG. 7 is a view of the first supporting plate and the second supporting plate being separated from a flat panel display according to an exemplary embodiment of the present invention.

FIG. 6 is a view of a thin film transistor array panel and a common electrode panel combined for a flat panel display according to an exemplary embodiment of the present invention, and FIG. 7 is a view of the first supporting plate and the second supporting plate separated from a flat panel display according to an exemplary embodiment of the present invention.

As shown in FIG. 6, a liquid crystal layer 3 is formed between the thin film transistor array panel 1000 and the common electrode panel 2000, and the thin film transistor array panel 1000 and the common electrode panel 2000 are combined.

As shown in FIG. 7, the first adhering member 12 and the second adhering member 22 are removed by using a laser beam 51 generated from a laser generation device 50. Next, the first supporting plate 10 and the second supporting plate 20 are respectively separated from the first substrate 100 and the second substrate 200.

Each of the first and second adhering members 12 and 22 is thin such that the first and second adhering members 12 and 22 may be substantially completely removed from the first and second supporting plates 10 and 20 by using the laser beam. Therefore, it is possible to reuse the first and second supporting plates 10 and 20.

The first adhering member 12 is coated on the first supporting plate 10. However, the first adhering member 12 may be coated on the first substrate 100. Next, an exemplary embodiment in which the first adhering member 12 is coated on the first substrate 100 will be described with reference to FIG. 8.

Figure 8:
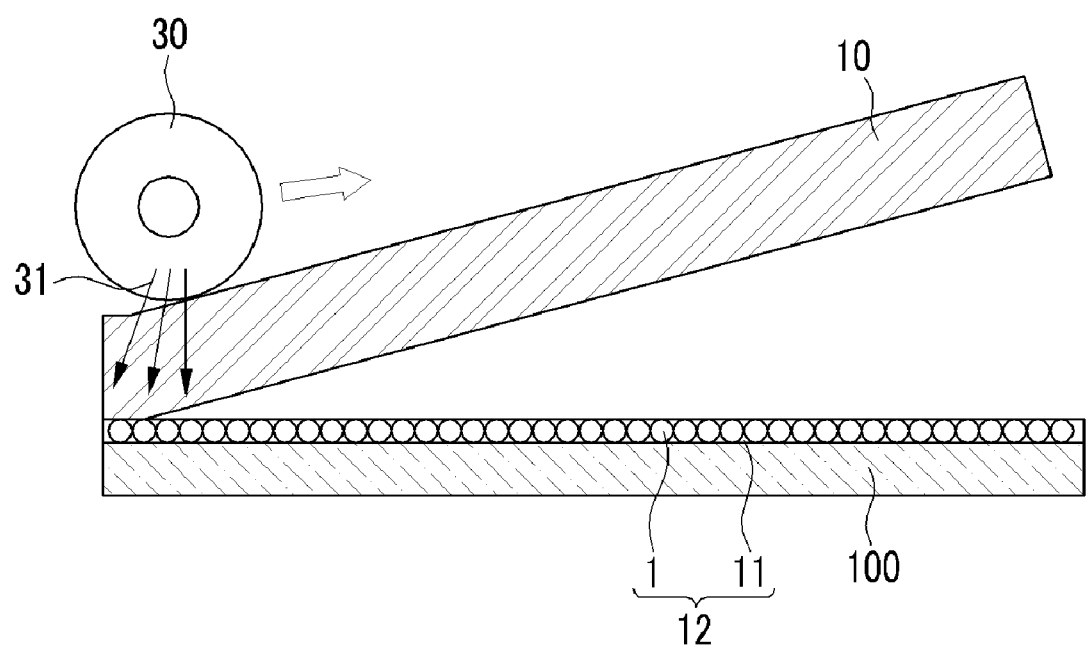
FIG. 8 is a view of a manufacturing method of a flat panel display according to another exemplary embodiment of the present invention.

FIG. 8 is a view illustrating a manufacturing method of a flat panel display according to another exemplary embodiment of the present invention.

The present exemplary embodiment is substantially similar to the exemplary embodiment shown in FIG. 1 to FIG. 7 except for the position of the first adhering member 12. Hence, redundant description is omitted.

As shown in FIG. 8, the first adhering member 12 is coated on the first substrate 100. The first substrate 100 includes a flexible material such as plastic. The first adhering member 12 may include a plurality of adhering particles 1 and the polyelectrolyte 11. The plurality of adhering particles 1 are made of a material such as a polyimide, and each particle has a spherical shape with a diameter less than a micron. In some embodiments, the diameter may be in the order of a nanometer (nm). The adhering particles 1 include the first adhering particles having a first reactor and the second adhering particles having a second reactor. In an example, the first reactor may contain COOH—, and the second reactor may contain NH2+.

The polyelectrolyte 11 electrostatically couples the plurality of adhering particles 1 to the first substrate 100 for the plurality of adhering particles 1 to securely adhere to the first substrate 100. As described above, the plurality of adhering particles 1 adhere to the first substrate 100 by using the polyelectrolyte 11. However, the first substrate 100 may be surface-treated using plasma discharge, corona discharge, or an alkali solvent for the plurality of adhering particles 1 to securely adhere to the first substrate 100.

Next, the first supporting plate 10 is disposed on the first adhering member 12 coated on the first substrate 100. The first supporting plate 10 may be made of a rigid material such as glass, SUS (steel use stainless), plastic. Next, the first supporting plate 10 is pressed while the ultrasonic wave generation device 30 of a roller shape is rolled on the first supporting plate 10. Here, the ultrasonic wave generation device 30 generates the ultrasonic waves 31. The ultrasonic waves 31 generated in the ultrasonic wave generation device 30 generate frictional heat at the interface between the first supporting plate 10 and the first adhering member 12, and the interface between the first substrate 100 and the first adhering member 12.

The first adhering particles having the first reactor and the second adhering particles having the second reactor are melted and coupled by the frictional heat. This way, the first supporting plate 10 and the first substrate 100 are adhered to each other.

The second adhering member 22 is coated on the second supporting plate 20. However, the second adhering member 22 may be coated on the second substrate 200.

While this invention has been described in connection with what is presently considered to be practical exemplary embodiments, it is to be understood that the invention is not limited to the disclosed embodiments. The invention is intended to cover various modifications and equivalent arrangements included within the spirit and scope of the appended claims and the disclosure above.

What is claimed is:

1. A method for manufacturing a flat panel display, the method comprising:
    coating a first adhering member on a first supporting plate, the first adhering member including a plurality of adhering particles and a polyelectrolyte;
    disposing a first substrate on the first adhering member;
    using ultrasonic waves to adhere the first supporting plate to the first substrate; and
    forming a gate line, a data line, a thin film transistor connected to the gate line and the data line, and a pixel electrode connected to the thin film transistor on the first substrate,
    wherein the polyelectrolyte electrostatically couples the plurality of adhering particles to the first supporting plate.

2. The method of claim 1, further comprising:
    coating a second adhering member on a second supporting plate;
    disposing a second substrate on the second adhering member;
    using ultrasonic waves to adhere the second supporting plate to the second substrate; and
    forming a common electrode on the second substrate.

3. The method of claim 2, further comprising:
    combining the first substrate and the second substrate; and
    removing the first adhering member and the second adhering member by using a laser beam to separate the first supporting plate and the second supporting plate from the first substrate and the second substrate, respectively.

4. The method of claim 1, wherein
    the first adhering member is formed on the first supporting plate by using an ultrasonic wave spray coating device.

5. The method of claim 1, wherein
    the first adhering member has a thickness of about 10 nm to about 1 µm.

6. The method of claim 5, wherein
the adhering particles include particles having diameters of less than a micrometer.

7. The method of claim 1, wherein
the adhering particles include particles having diameters of about a nanometer.

8. The method of claim 1, wherein
the plurality of adhering particles include first adhering particles having a first reactor and second adhering particles having a second reactor, and the first adhering particles having the first reactor and the second adhering particles having the second reactor are combined by the ultrasonic waves.

9. A method for manufacturing a flat panel display, the method comprising:
coating a first adhering member on a first substrate, the first adhering member including a plurality of adhering particles and a polyelectrolyte;
disposing the first substrate coated with the first adhering member on a first supporting plate to place the first adhering member in contact with the first supporting plate;
using ultrasonic waves to adhere the first supporting plate and the first substrate; and
forming a gate line, a data line, a thin film transistor connected to the gate line and the data line, and a pixel electrode connected to the thin film transistor on the first substrate,
wherein the polyelectrolyte electrostatically couples the plurality of adhering particles to the first supporting plate.

10. The method of claim 9, further comprising:
coating a second adhering member on a second substrate;
disposing the second substrate coated with the second adhering member on the second supporting plate to place the second adhering member in contact with the second supporting plate;
using ultrasonic waves to adhere the second supporting plate and the second substrate; and
forming a common electrode on the second substrate.

11. The method of claim 9, wherein
the first adhering member is formed on the first substrate by using an ultrasonic wave spray coating device.

12. The method of claim 9, wherein
the first adhering member has a thickness of about 10 nm to about 1 μm.

13. The method of claim 9, wherein
the plurality of adhering particles include first adhering particles having a first reactor and second adhering particles having a second reactor, and the first adhering particles having the first reactor and the second adhering particles having the second reactor are combined by the ultrasonic waves.

14. The method of claim 10, further comprising:
combining the first substrate and the second substrate; and
removing the first adhering member and the second adhering member by using a laser beam to separate the first supporting plate and the second supporting plate from the first substrate and the second substrate.

* * * * *